United States Patent
Anderson et al.

(10) Patent No.: US 8,053,870 B2
(45) Date of Patent: Nov. 8, 2011

(54) SEMICONDUCTOR STRUCTURE INCORPORATING MULTIPLE NITRIDE LAYERS TO IMPROVE THERMAL DISSIPATION AWAY FROM A DEVICE AND A METHOD OF FORMING THE STRUCTURE

(75) Inventors: Brent A. Anderson, Jericho, VT (US); Joseph M. Lukaitis, Pleasant Valley, NY (US); Jed H. Rankin, South Burlington, VT (US); Robert R. Robison, Colchester, VT (US)

(73) Assignee: International Business Machines Corporation, Armonk, NY (US)

( * ) Notice: Subject to any disclaimer, the term of this patent is extended or adjusted under 35 U.S.C. 154(b) by 49 days.

(21) Appl. No.: 12/638,004

(22) Filed: Dec. 15, 2009

(65) Prior Publication Data

US 2011/0140279 A1    Jun. 16, 2011

(51) Int. Cl.
*H01L 23/58* (2006.01)
(52) U.S. Cl. ................... 257/637; 257/635
(58) Field of Classification Search ............. 257/635, 257/637, 707, 706, 758; 438/122
See application file for complete search history.

(56) References Cited

U.S. PATENT DOCUMENTS

| | | | |
|---|---|---|---|
| 3,609,471 A | 9/1971 | Scace et al. | |
| 4,536,469 A | 8/1985 | Adlerstein | |
| 5,683,939 A | 11/1997 | Schrantz et al. | |
| 6,091,121 A * | 7/2000 | Oda | 257/408 |
| 6,271,593 B1 * | 8/2001 | Givens et al. | 257/752 |
| 6,381,094 B1 | 4/2002 | Gill | |
| 6,476,483 B1 | 11/2002 | Adler et al. | |
| 6,651,736 B2 * | 11/2003 | Chiu et al. | 165/185 |
| 7,052,937 B2 | 5/2006 | Clevenger et al. | |
| 7,314,836 B2 | 1/2008 | Golonzka et al. | |
| 7,332,807 B2 * | 2/2008 | Dani et al. | 257/706 |
| 7,345,364 B2 | 3/2008 | Kerr et al. | |
| 2006/0133174 A1 * | 6/2006 | Kim et al. | 365/222 |
| 2006/0231919 A1 | 10/2006 | Blacka et al. | |
| 2011/0070726 A1 * | 3/2011 | Dickenscheid et al. | 438/591 |

OTHER PUBLICATIONS

M.A.L. Johnson, "The Performance of Electronic Devices Mounted on Aluminum Nitride," Proceedings of the 39th Electronic Components Conference (Cat. 89CH2775-5), Published by IEEE, Abstract.
Walter Lang, "Heat Transport From a Chip," IEEE Transactions on Electron Devices, vol. 37, No. 4, Apr. 1990, pp. 958-963.
Guo et al., "Propogation Layers for Intra-Chip Wireless Interconnection Compatible with Packaging and Heat Removal," IEEE, Symposium on VLSI Technology Digest of Technical Papers, 2002, pp. 36-37.

* cited by examiner

*Primary Examiner* — Sheila V Clark
(74) *Attorney, Agent, or Firm* — Gibb I.P. Law Firm, LLC; Richard M. Kotulak, Esq.

(57) ABSTRACT

Disclosed are embodiments of a semiconductor structure that incorporates multiple nitride layers stacked between the center region of a device and a blanket oxide layer. These nitride layers are more thermally conductive than the blanket oxide layer and, thus provide improved heat dissipation away from the device. Also disclosed are embodiments of a method of forming such a semiconductor structure in conjunction with the formation of any of the following nitride layers during standard processing of other devices: a nitride hardmask layer (OP layer), a "sacrificial" nitride layer (SMT layer), a tensile nitride layer (WN layer) and/or a compressive nitride layer (WP layer). Optionally, the embodiments also incorporate incomplete contacts that extend through the blanket oxide layer into one or more of the nitride layers without contacting the device in order to further improve heat dissipation.

25 Claims, 9 Drawing Sheets

SEMICONDUCTOR STRUCTURE INCORPORATING MULTIPLE NITRIDE LAYERS TO IMPROVE THERMAL DISSIPATION AWAY FROM A DEVICE AND A METHOD OF FORMING THE STRUCTURE

BACKGROUND

1. Field of the Invention

The embodiments of the invention generally relate to heat dissipation away from heating generating devices, such as polysilicon resistors. More particularly, the embodiments of the invention relate to a semiconductor structure incorporating multiple nitride layers to improve heat dissipation away from a device and to a method of forming the structure using nitride layers deposited during standard processing.

2. Description of the Related Art

Currently, it is quite challenging to provide adequate heat dissipation away from heat generating devices, such as polysilicon resistors, which can exhibit significant temperature fluctuations (e.g., temperature fluctuations of up to 10° C. or more). This is due both to size scaling of such devices and to the fact that such devices are often sandwiched between materials having low thermal conductivity (e.g., between a silicon-on-insulator (SOI) substrate and a low-K interlayer dielectric, such as an oxide layer). Inadequate heat dissipation can impact both immediate and surrounding devices and can cause particular problems with respect to the maximum allowed current density of thermally sensitive structures (e.g., polysilicon resistors).

SUMMARY

Disclosed herein are embodiments of a semiconductor structure. In each of the embodiments, the semiconductor structure can comprise a heat generating device and, more particularly, a thermally sensitive device. Multiple nitride layers can be positioned above the center region of the device in order to provide improved heat dissipation (i.e., in order to conduct heat away from the device). These multiple nitride layers can comprise at least a first nitride layer conformally covering the device, a second nitride layer conformally covering the first nitride layer, and a third nitride layer above the second nitride layer. The third nitride layer can be shorter in length than the device and the other nitride layers such that the end regions of the device, of the first nitride layer and of the second nitride layer extend laterally beyond the third nitride layer. Additionally, a blanket oxide layer (i.e., an interlayer dielectric) can be positioned above the multiple nitride layers. Specifically, this blanket oxide layer can have a first portion above the third nitride layer and second portions extending laterally beyond the third nitride layer. Thus, the first portion of the blanket oxide layer above the center region of the device is thinner than the second portions of the blanket oxide layer above the end regions of the device. Finally, contacts can extend vertically through the blanket oxide layer, the second nitride layer and the first nitride layer to the end regions of the device.

The embodiments of the semiconductor structure can also comprise one or more optional features. For example, optionally, the semiconductor structure can comprise one or more incomplete contacts (i.e., contacts that do not extend to the device, also referred to herein as unconnected or partial contacts). Such incomplete contact(s) can be positioned laterally between the device contacts (i.e., above the center region of the device). They can extend vertically through the blanket oxide layer and into at least the third nitride layer without contacting the device (i.e., the incomplete contact(s) should have a shallower depth than the device contacts). Incomplete contact(s) extending into the nitride layers provide additional pathway(s) for heat to be dissipated away from the device.

Also disclosed herein are embodiments of a method of forming the above-described semiconductor structure with or without any of the optional features. Specifically, each of the method embodiments can comprise forming a heat generating device and, more particularly, a thermally sensitive device, on a semiconductor wafer. After the device is formed, conventional semiconductor processing can be performed including the performance of multiple (e.g., at least three) discrete nitride deposition and patterning processes (e.g., nitride hard mask deposition and patterning, tensile nitride deposition and patterning, compressive nitride deposition and patterning, etc.) in order to form multiple nitride layers at various locations on the semiconductor wafer. During the nitride deposition and patterning processes, most, if not all, of the multiple nitride layers can be formed above the center region of the device to provide for improved heat dissipation.

Specifically, a first nitride layer can be formed such that it conformally covers the device, a second nitride layer can be formed such that it conformally covers the first nitride layer, and a third nitride layer can be formed above the second nitride layer. The third nitride layer can be deposited and then patterned such that it is shorter in length than the device and the other nitride layers and, more specifically, such that the end regions of the device, of the first nitride layer and of the second nitride layer extend laterally beyond the third nitride layer. Next, a blanket oxide layer (i.e., an interlayer dielectric) can be formed above the multiple nitride layers. Specifically, this blanket oxide layer can be formed such that it has a first portion above the third nitride layer and second portions extending laterally beyond the third nitride layer. Thus, the first portion of the blanket oxide layer above the center region of the device will be thinner than the second portions of the blanket oxide layer above the end regions of the device. Finally, contacts can be formed that extend vertically through the blanket oxide layer, the second nitride layer and the first nitride layer to the end regions of the device. That is, contact openings can be patterned above the end regions of the device and etched such that they extend vertically through the blanket oxide layer, the second nitride layer and the first nitride layer down to the end regions of the device. These contact openings can then be filled with a conductor to form contacts to the end regions of the device.

The embodiments of the method can also comprise one or more optional process steps. For example, optionally, as the contact openings are patterned, etched and filled with a conductor (as discussed above) to form the contacts, at least one incomplete contact opening (i.e., at least one contact opening that does not extend to the device, also referred to herein as an unconnected or partial contact opening) can be simultaneously be patterned, etched and filled with a conductor to form at least one incomplete contact (i.e., at least one contact that does not extend to the device, also referred to herein as an unconnected or partial contact). Specifically, the incomplete contact opening(s) can be patterned between the contact openings (i.e., above the center region of the device). The incomplete contact opening(s) can further be etched such that it/they extend vertically through the blanket oxide layer and into at least the third nitride layer. During the etch process, the incomplete contact openings will self-arrest prior to reaching the device, due to the slower etch rate through the nitride layers as compared to the oxide layer. That is, because the ratio of oxide to nitride is greater above the end regions of the device than the center region, the contact openings can be etched through to the device and the etch process stopped before the incomplete contact openings reach the device. Thus, as a result of the same patterning and etching processes, contact openings and incomplete contact opening(s) are simultaneously formed with the incomplete contact opening(s) having a shallower depth than the contact openings. Once filled with conductor material, the incomplete contact(s) that extend into the nitride layers provide additional pathway(s) for heat to be dissipated away from the device.

BRIEF DESCRIPTION OF THE SEVERAL VIEWS OF THE DRAWINGS

The embodiments of the invention will be better understood from the following detailed description with reference to the drawings, which are not necessarily drawing to scale and in which.

DETAILED DESCRIPTION

Figure 1:
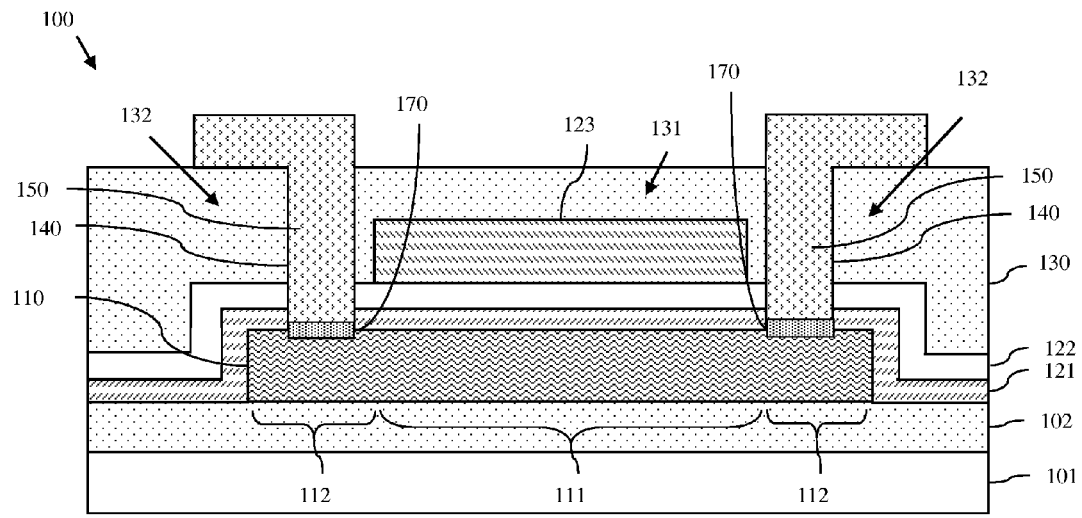
FIG. 1 is a cross-section diagram illustrating an embodiment of a semiconductor structure.

The embodiments of the invention and the various features and advantageous details thereof are explained more fully with reference to the non-limiting embodiments that are illustrated in the accompanying drawings and detailed in the following description.

As mentioned above, currently, it is quite challenging to provide adequate heat dissipation away from heat generating devices, such as polysilicon resistors, which can exhibit significant temperature fluctuations (e.g., temperature fluctuations of up to 10° C. or more). This is due both to size scaling of such devices and to the fact that such devices are often sandwiched between materials having low thermal conductivity (e.g., between a silicon-on-insulator (SOI) substrate and a low-K interlayer dielectric, such as an oxide layer). Inadequate heat dissipation can impact both immediate and surrounding devices and can cause particular problems with respect to the maximum allowed current density of thermally sensitive structures (e.g., polysilicon resistors).

In view of the foregoing, disclosed herein are embodiments of a semiconductor structure that incorporates multiple nitride layers (e.g., silicon nitride (SiN) layers) stacked between the center region of a device (e.g., a thermally sensitive device, such as a polysilicon resistor) and a blanket oxide layer (e.g., a silicon dioxide ($SiO_2$) layer). These nitride layers are more thermally conductive than the blanket oxide layer (e.g., 1.1 W/m–K for a $SiO_2$ versus 30 W/m–K for a SiN layer) and, thus provide improved heat dissipation away from the device. Optionally, incomplete contacts can extend through the blanket oxide layer into one or more of the nitride layers without contacting the device in order to further improve heat dissipation. Also disclosed are embodiments of a method of forming such a semiconductor structure. In the method embodiments, multiple nitride layers can be formed above the center region of a device in conjunction with the formation of any of the following nitride layers during standard processing of other devices: a nitride hardmask layer (OP layer), a "sacrificial" nitride layer (SMT layer), a tensile nitride layer (WN layer) and/or a compressive nitride layer (WP layer). Optionally, at the same time as contacts are formed to the end regions of the device, one or more incomplete contacts can also be formed above the center region of the device to provide additional heat dissipation. Due to the difference in the oxide-to-nitride material ratio above the center region of the device as compared to above the end regions of the device, the openings for the incomplete contact(s) will self-arrest prior to reaching the device.

More particularly, disclosed herein are embodiments of a semiconductor structure 100 (see FIGS. 1-5). In each of the embodiments, the semiconductor structure 100 can comprise a heat generating device 110 and, more particularly, a thermally sensitive device. For example, the device 110 can comprise a resistor, a diode, a capacitor, an inductor, or any other thermally sensitive device. For illustration purposes, the device 110 is shown in FIGS. 1-5 as a polysilicon resistor. This device 110 can be positioned, for example, above on an insulator layer 102 (e.g., a buried oxide layer) on a semiconductor substrate 101 (e.g., a silicon substrate).

Multiple nitride layers (e.g., multiple silicon nitride (SiN) layers) can be positioned above the center region 111 of the device 110 in order to provide improved heat dissipation (i.e., in order to conduct heat up and away from the device 110). These multiple nitride layers can comprise at least a first nitride layer 121 conformally covering the device 110, a second nitride layer 122 conformally covering the first nitride layer 121, and a third nitride layer 123 above the second nitride layer 122. The third nitride layer 123 can be shorter in length than the device 110 and the other nitride layers 121, 122 such that the end regions 112 of the device 110, of the first nitride layer 121 and of the second nitride layer 122 extend laterally beyond the third nitride layer 123. As discussed in greater detail with regard to the method embodiments below, these nitride layers can comprise standard nitride layers used in conventional semiconductor processing. For example, the first nitride layer 121 can comprise a nitride hardmask layer (also referred to as an OP layer). The second nitride layer 122 can comprise a strained nitride layer (e.g., a tensile nitride layer also referred to as a WN layer) and the third nitride layer 123 can comprise another strained nitride layer (e.g., a compressive nitride layer also referred to as a WP layer).

Additionally, a blanket oxide layer 130 (i.e., an interlayer dielectric, such as a silicon oxide layer (SiO$_2$)) can be positioned above the multiple nitride layers 121-123. Specifically, this blanket oxide layer 130 can have a first portion 131 above the third nitride layer 123 and second portions 132 extending laterally beyond the third nitride layer 123. Thus, the first portion 131 of the blanket oxide layer 130 above the center region 111 of the device 110 is thinner than the second portions 131 of the blanket oxide layer 130 above the end regions 112 of the device 110.

Finally, contacts 140 can extend vertically through the blanket oxide layer 130, the second nitride layer 122 and the first nitride layer 121 to a silicide layer 170 on the end regions 111 of the device 110. These contacts 140 can optionally be lined with a conductive barrier layer (e.g., nickel, palladium (PD) platinum (Pt) or any other suitable conductive barrier layer cable of preventing electro-migration) and can further be filled with a conductor 150 (e.g., copper (Cu), aluminum (Al) or some other suitable contact metal or contact metal alloy).

Figure 2:
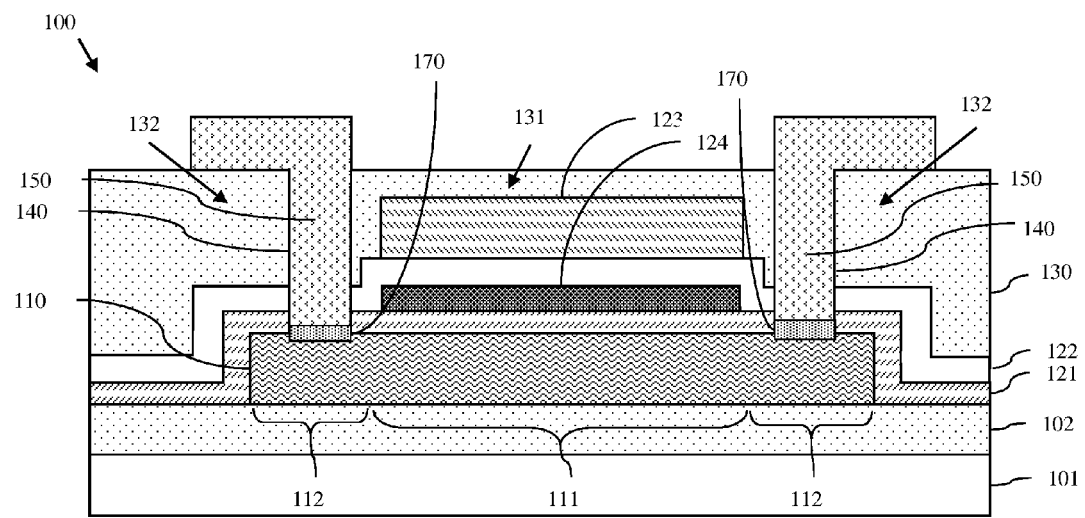
FIG. 2 is a cross-section diagram illustrating another embodiment of the semiconductor structure.
Figure 5:
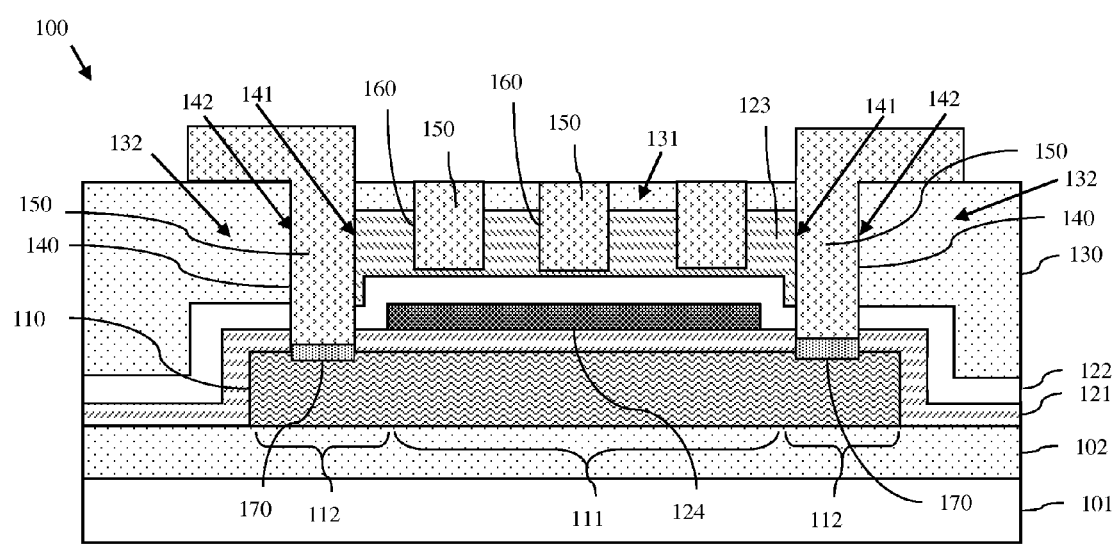
FIG. 5 is a cross-section diagram illustrating another embodiment of the semiconductor structure.

The embodiments of the semiconductor structure 100 can also comprise one or more of the following optional features. For example, as illustrated in FIGS. 2 and 5, optionally, the semiconductor structure 100 can comprise one or more additional nitride layers above the center region 111 of the device 110 (e.g., a fourth nitride layer 124 between the first nitride layer 121 and the second nitride layer 122). Like the third nitride layer 123, this fourth nitride layer 124 can be shorter in length than the device 110 and the first and second nitride layers 121-122 such that the end regions 112 of the device 110, of the first nitride layer 121 and of the second nitride layer 122 extend laterally beyond the fourth nitride layer 124. Such a fourth nitride layer 124 increases the thickness of the nitride layer stack (i.e., the thickness of the combination of all nitride layers) above the center region 111 of the device 110 and, thereby provides greater thermal dissipation. As with the nitride layers 121-123, the fourth nitride layer 124 can comprise a standard nitride layer used in conventional semiconductor processing. For example, the fourth nitride layer 124 can comprise a nitride layer that, during conventional semiconductor processing, is deposited after the nitride hardmask layer and typically subsequently removed (i.e., a sacrificial nitride layer, also referred to as a SMT layer).

Figure 3:
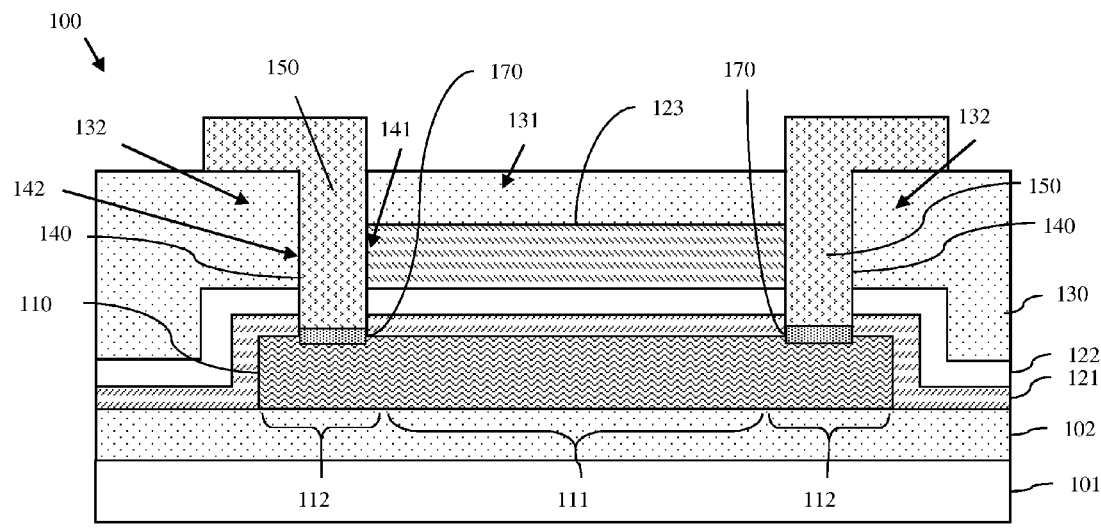
FIG. 3 is a cross-section diagram illustrating another embodiment of the semiconductor structure.

Also, optionally, as illustrated in FIGS. 3 and 5, the contacts 140 and, more particularly, the openings for the contacts 140 can be patterned such that each has, at a level of the third nitride layer 123, an inner sidewall 141 in contact with the third nitride layer 123 and an outer sidewall 142 in contact with the blanket oxide layer 130. Contacts 140 positioned immediately adjacent to the third nitride layer 123, rather than extending only through the blanket oxide layer 130 at this level (as shown in FIG. 1), provide an additional pathway for heat to be dissipated away from the device 110.

Figure 4:
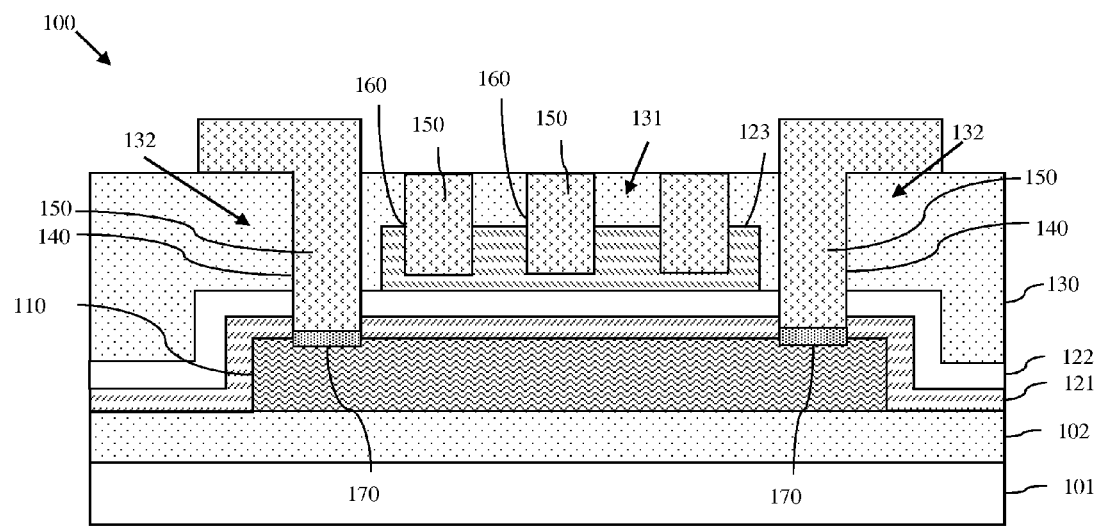
FIG. 4 is a cross-section diagram illustrating another embodiment of the semiconductor structure.

Also, optionally, as illustrated in FIGS. 4 and 5, the semiconductor structure 100 can comprise one or more incomplete contacts 160 (i.e., contacts that extend towards but do not reach the device 110, also referred to herein as unconnected or partial contacts). Such incomplete contact(s) 160 can comprise conductor 150-filled opening(s) or via(s) positioned laterally between the device contacts 140 (i.e., above the center region 111 of the device 110). They can extend vertically through the blanket oxide layer 130 and into at least the third nitride layer 123 and possibly into the second nitride layer 122 and first nitride layer 123 without contacting the device 110 (i.e., the incomplete contact(s) 160 should have a shallower depth than the device contacts 140). Incomplete contact(s) 160 that extend into the nitride layers without contacting the device 110 provide additional pathway(s) for heat to be dissipated away from the device 110.

As mentioned above, any one or more of these optional features can be incorporated into the structure embodiments of the present. For example, see FIG. 5 incorporating each of these optional features.

Figure 6:
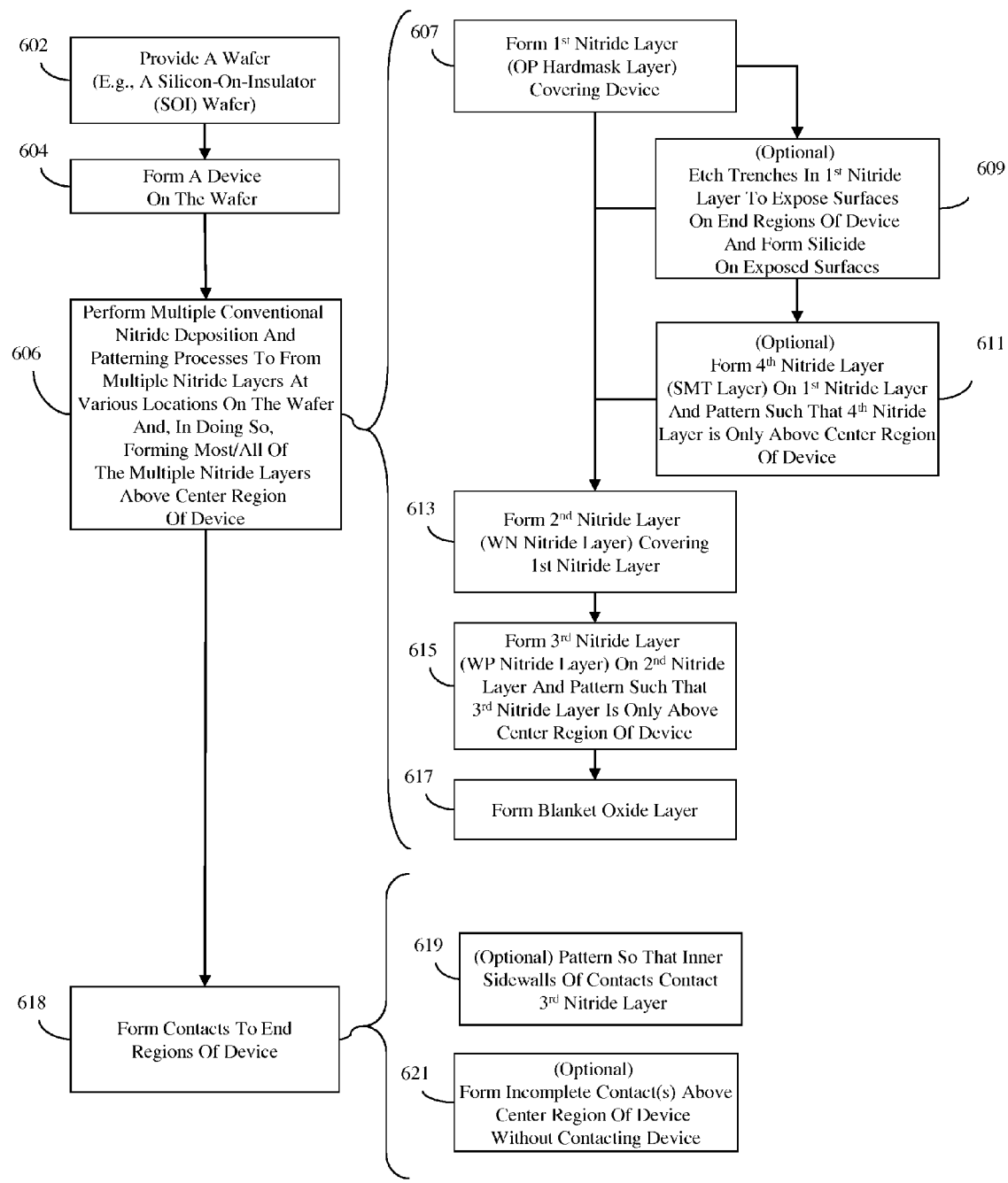
FIG. 6 is a flow diagram illustrating embodiments of a method of forming a semiconductor structure.
Figure 7:
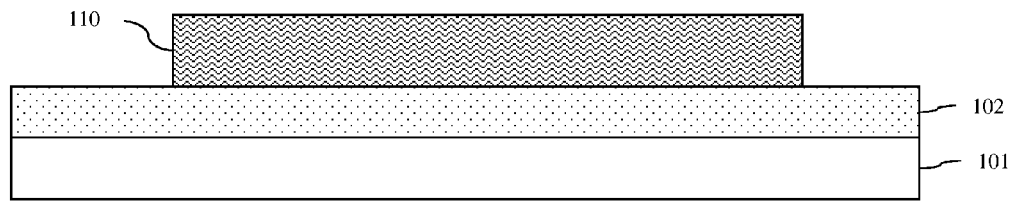
FIG. 7 is a cross-diagram illustrating a partially completed semiconductor structure formed according to the method of FIG. 6.

Referring to the flow diagram of FIG. 6, disclosed herein are embodiments of a method of forming the above-described semiconductor structure 100 with or without any of the optional features. Specifically, each of the method embodiments can comprise providing a wafer, such as a silicon-on-insulator (SOI) wafer (602). Next, a heat generating device 110 and, more particularly, a thermally sensitive device is formed on the wafer (604, see FIG. 7). For example, a resistor, a diode, a capacitor, an inductor, or any other thermally sensitive device 1100 can be formed on an insulator layer 102 (e.g., a buried oxide layer (BOX) layer) above a semiconductor substrate (e.g., a silicon substrate) of an SOI wafer. For illustration purposes, the device 110 shown in FIG. 7 is a polysilicon resistor. The process steps and, particularly, the front end of the line (FEOL) process steps used to form such devices are well-known in the art and, thus, are omitted from this specification in order to allow the reader to focus on the salient aspects of the embodiments described herein. After the device 110 is formed, conventional semiconductor processing can be performed including the performance of multiple (e.g., at least three) discrete nitride deposition and patterning processes (e.g., nitride hard mask deposition and patterning, tensile nitride deposition and patterning, compressive nitride deposition and patterning, etc.) in order to form multiple nitride layers (e.g., silicon nitride (SiN) layers) at various locations on the semiconductor wafer. During the nitride deposition and patterning processes, most, if not all, of the multiple nitride layers can be formed above the center region 111 of the device 110 to provide for improved heat dissipation (606).

Figure 8:
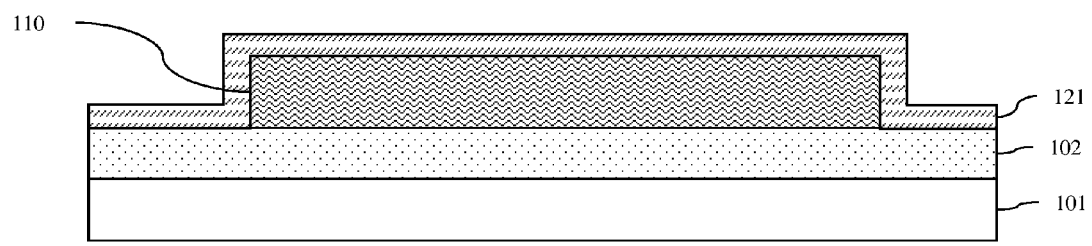
FIG. 8 is a cross-diagram illustrating a partially completed semiconductor structure formed according to the method of FIG. 6.

Specifically, a first nitride layer 121 can be formed (e.g., deposited) such that it conformally covers the device 110 (607, see FIG. 8). This first nitride layer 121 can, for example, be formed in conjunction with (i.e., at the same times as) the deposition and patterning of a standard nitride hardmask layer (OP layer) during conventional processing of other devices on the wafer.

Figure 9:
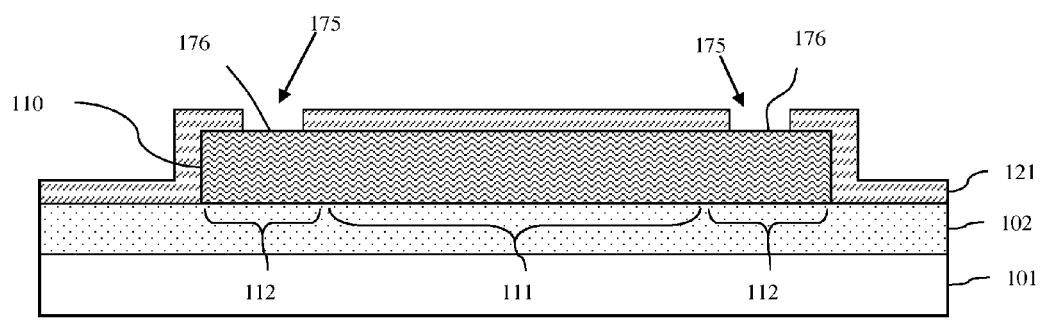
FIG. 9 is a cross-diagram illustrating a partially completed semiconductor structure formed according to the method of FIG. 6.
Figure 10:
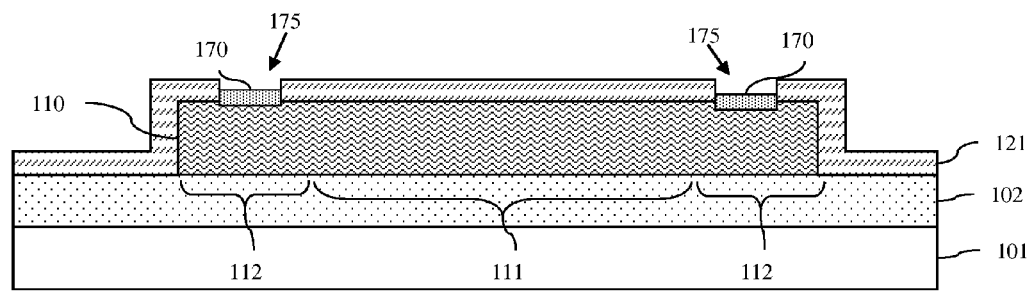
FIG. 10 is a cross-diagram illustrating a partially completed semiconductor structure formed according to the method of FIG. 6.

Optionally, trenches 175 can be formed (i.e., patterned and etched) in the first nitride layer 121 to expose surfaces 176 of the end regions 111 of the device 110 and a metal silicide layer 170 (e.g., a cobalt, platinum, nickel or other suitable conducting metal silicide layer) can be formed, using conventional metal silicide processing techniques, on the exposed surfaces (609, see FIGS. 9-10).

Figure 11:
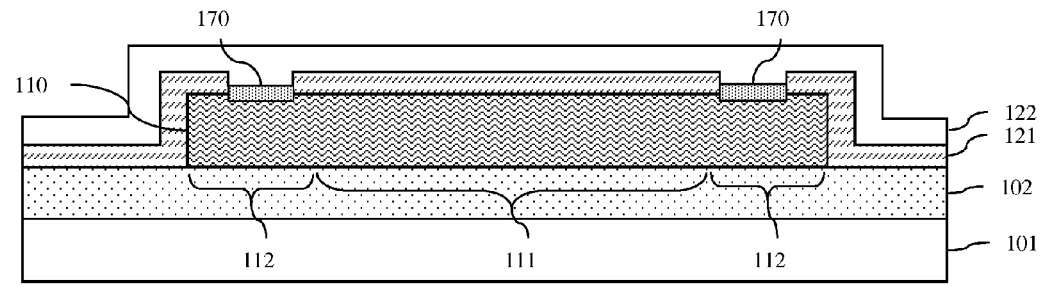
FIG. 11 is a cross-diagram illustrating a partially completed semiconductor structure formed according to the method of FIG. 6.

Next, a second nitride layer 122 can be formed such that it conformally covers the first nitride layer 123 (613, see FIG. 11). This second nitride layer 122 can, for example, be formed in conjunction with the deposition and patterning of a strained nitride layer (e.g., a tensile nitride layer (also referred to as a WN layer) during conventional processing of other devices (e.g., n-type field effect transistors) on the wafer.

Figure 12:
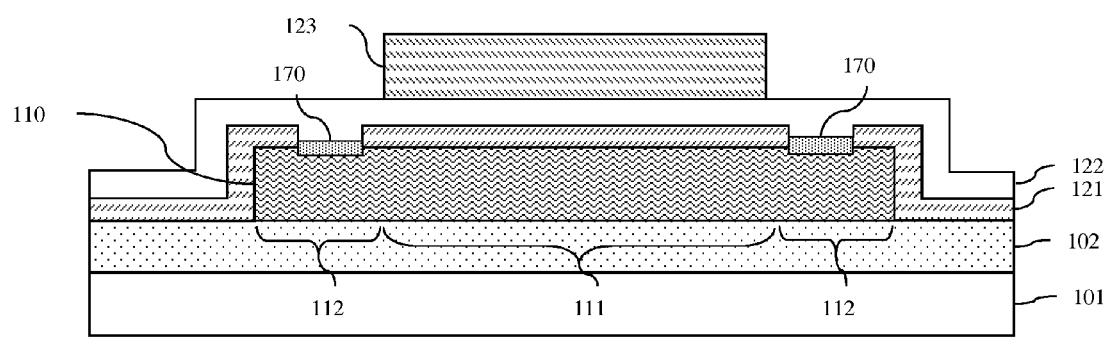
FIG. 12 is a cross-diagram illustrating a partially completed semiconductor structure formed according to the method of FIG. 6.

After formation of the second nitride layer 122, a third nitride layer 123 can be formed above the second nitride layer 122 (615, see FIG. 12). The third nitride layer 123 can be deposited and then patterned above the center region 111 of the device 110 such that it is shorter in length than the device 110 and the other nitride layers 121-122 and, more specifically, such that the end regions 112 of the device 110, of the first nitride layer 121 and of the second nitride layer 122 extend laterally beyond the third nitride layer 123. This third nitride layer 123 can, for example, be formed in conjunction with (i.e., at the same time as) the deposition and patterning of another strained nitride layer (e.g., a compressive nitride layer (also referred to as a WP layer) during conventional processing of other devices (e.g., p-type field effect transistors) on the wafer.

Thus, the multiple nitride layers can be formed at process 606 by simply adjusting mask rules to allow for the application of existing nitride layer in the process flow to be formed over device 110 without regard to the stress condition.

Figure 13:
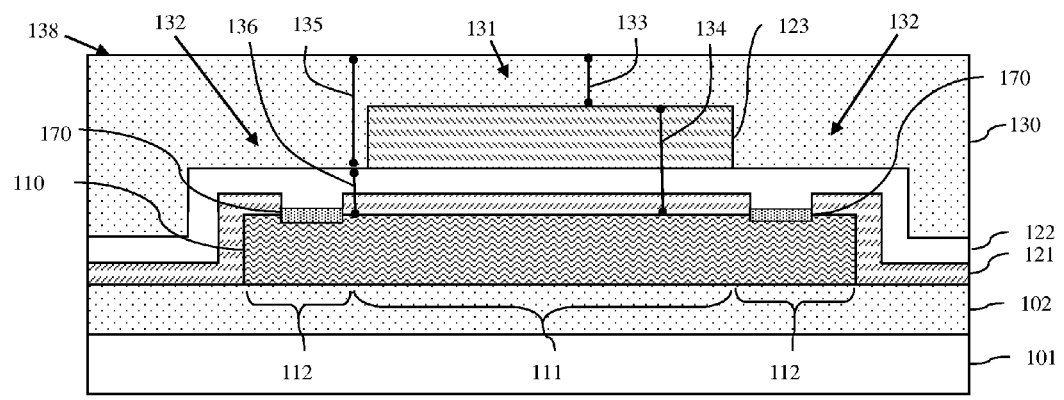
FIG. 13 is a cross-diagram illustrating a partially completed semiconductor structure formed according to the method of FIG. 6.

Next, a blanket oxide layer 130 (i.e., an interlayer dielectric, e.g., a silicon dioxide (SiO$_2$) layer) can be formed (e.g., deposited) over the multiple nitride layers (617, see FIG. 13). Specifically, this blanket oxide layer 130 can be formed such that it has a first portion 131 above the third nitride layer 123 and second portions 132 extending laterally beyond the third nitride layer 123. Thus, the thickness 133 of the first portion 131 of the blanket oxide layer 130 above the center region 111 of the device 110 will be less than the thickness 135 of the second portions 132 of the blanket oxide layer above the end regions 112 of the device, whereas the combined thickness 134 of the nitride layers above the center region 111 of the device 110 will be greater than the combined thickness 136 of the nitride layers above the end regions 112 of the device 110.

Figure 14:
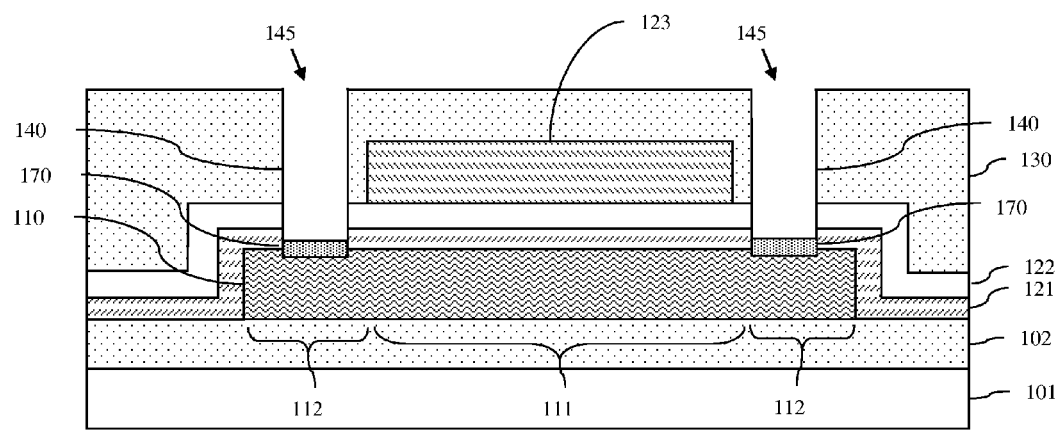
FIG. 14 is a cross-diagram illustrating a partially completed semiconductor structure formed according to the method of FIG. 6.
Figure 15:
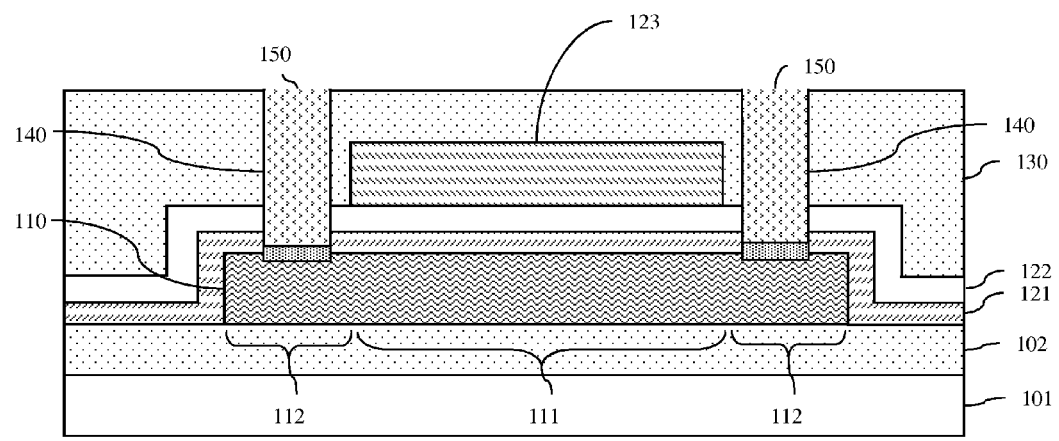
FIG. 15 is a cross-diagram illustrating a partially completed semiconductor structure formed according to the method of FIG. 6.

Finally, contacts 140 can be formed (e.g., using conventional damascene or dual damascene techniques) that extend vertically through the blanket oxide layer 130, the second nitride layer 122 and the first nitride layer 123 to the end regions 112 of the device 110 (618). That is, contact openings 145 can be patterned above the end regions 112 of the device 110 and etched (e.g., using a reactive ion etch (RIE) process) such that they extend vertically through the blanket oxide layer 130, the second nitride layer 122 and the first nitride layer 121 down to the silicide 170 at the end regions 112 of the device 110 (see FIG. 14). These contact openings 145 can then be optionally lined with a conductive barrier layer (e.g., nickel, palladium (PD) platinum (Pt) or any other suitable conductive barrier layer cable of preventing electro-migration) and filled with a conductor 150 (e.g., copper (Cu), aluminum (Al) or some other suitable contact metal or contact metal alloy) to form contacts 140 to the end regions 112 of the device 110 (see FIG. 15).

Figure 16:
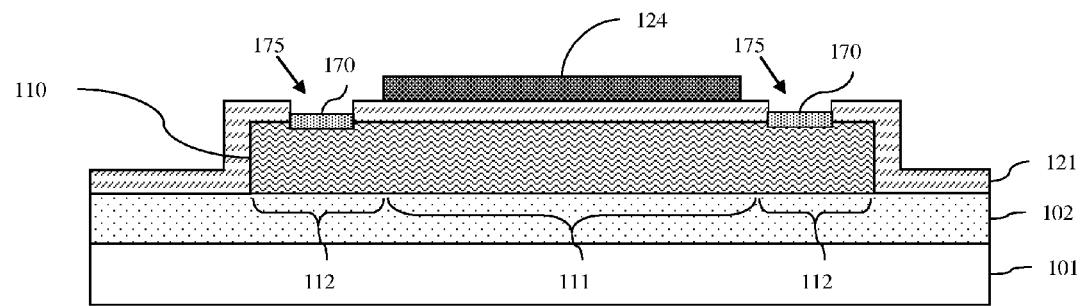
FIG. 16 is a cross-diagram illustrating a partially completed semiconductor structure formed according to the method of FIG. 6.

The embodiments of the method can also comprise one or more of the following optional process steps. For example, optionally, the process 606 of forming multiple nitride layers can comprise forming one or more additional nitride layers. For example, prior to the formation of the second nitride layer 122 (see process 613) a fourth nitride layer 124 can be formed on the first nitride layer 121 (611, see FIG. 16). Like the third nitride layer 123, this fourth nitride layer 124 can be deposited and then patterned above the center region 111 of the device such that it is shorter in length than the device 110 and the first nitride layer 121. In the resulting structure 100, as illustrated in FIG. 2 and FIG. 5, this fourth nitride layer 124 increases the thickness of the nitride layer stack above the center region 111 of the device 110 and, thereby provides greater thermal dissipation. This fourth nitride layer 124 can, for example, be formed in conjunction with (i.e., at the same time as) the deposition of a sacrificial nitride layer (also referred to as an SMT layer) during conventional processing of other devices on the wafer. However, when the sacrificial nitride layer is subsequently removed from other devices, additional masking steps can be used to ensure that it remains above the device 110.

Figure 17:
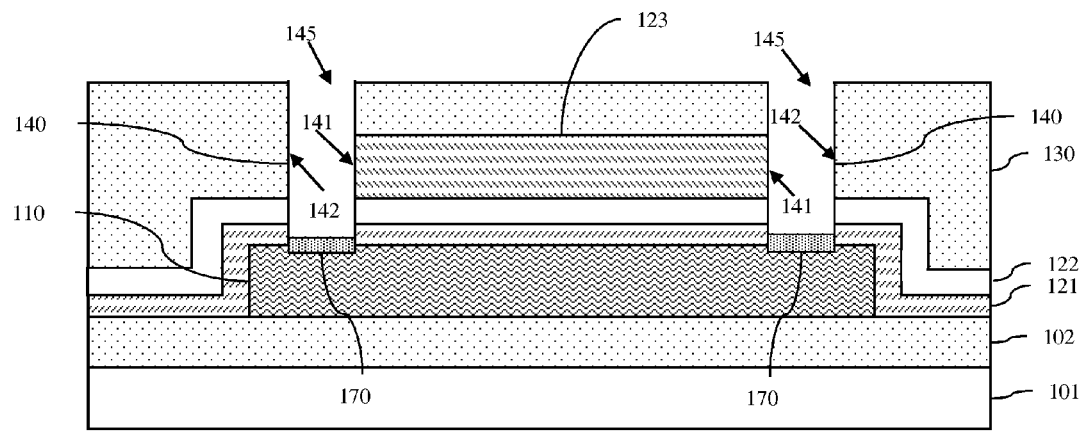
FIG. 17 is a cross-diagram illustrating a partially completed semiconductor structure formed according to the method of FIG. 6.

Also, optionally, the method embodiments can comprise patterning the contact openings 145 during the contact 140 formation process 618 such that, at a level of the third nitride layer 123, each of the contact openings 145 has an inner sidewall 141 in contact with the third nitride layer 123 and an outer sidewall 142 in contact with the blanket oxide layer 130 (619, see FIG. 17). Thus, once filled with conductor 150, the resulting contacts 140 will be positioned immediately adjacent to the third nitride layer 123, rather than extending only through the blanket oxide layer 130 at this level (see FIGS. 3 and 5). Such a configuration provides an additional pathway for heat to be dissipated away from the device 110.

Also, optionally, as the contact openings 145 are patterned, etched, optionally lined and filled with a conductor 150 (as discussed above) to form the contacts 140, at least one incomplete contact opening 165 (i.e., at least one contact opening that does not extend to the device 110, also referred to herein as an unconnected or partial contact opening) can be simultaneously be patterned, etched (see FIG. 18), optionally lined and filled with the same conductor 150 to form at least one incomplete contact 160 (i.e., a contact that does not extend to the device 110, also referred to herein as an unconnected or partial contact) (621, see FIGS. 4-5). Incomplete contact(s) 160 extending into the nitride layers provide additional pathway(s) for heat to be dissipated away from the device 110.

Figure 18:
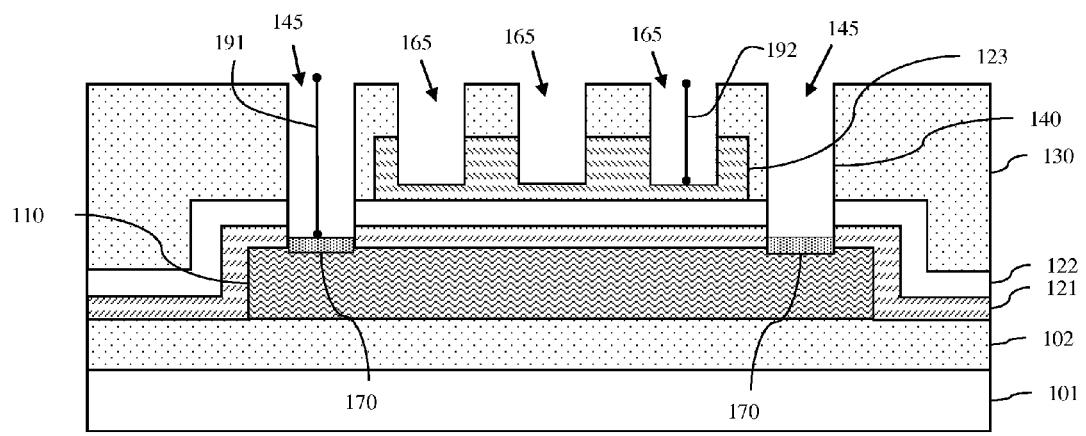
FIG. 18 is a cross-diagram illustrating a partially completed semiconductor structure formed according to the method of FIG. 6.

Specifically, during patterning of contact openings 145, incomplete contact opening(s) 165 can be patterned so that it/they is/are positioned laterally between the contact openings 145 (i.e., above the center region 111 of the device 110) (see FIG. 18). Furthermore, the etch process used to form the contact openings 145 and the incomplete contact opening(s) 165 can be performed so that the contact openings 145 terminate on the device 110 and further so that the incomplete contact openings 165 self-arrest prior to reaching the device 110 (i.e., such that incomplete contact openings 165 extend vertically through the blanket oxide layer 130 and into at least the third nitride layer 123 without contacting the device 110).

For example, to form the contact and incomplete contact openings 145, 165, a single etch process can be performed that has a faster etch rate for oxide materials as compared to nitride materials. As discussed above, the thickness 133 of the first portion 131 of the blanket oxide layer 130 above the center region 111 of the device 110 will be less than the thickness 135 of the second portions 132 of the blanket oxide layer above the end regions 112 of the device, whereas the combined thickness 134 of the nitride layers above the center region 111 of the device 110 will be greater than the combined thickness 136 of the nitride layers above the end regions 112 of the device 110. In other words, the oxide to nitride ratio above the end regions 112 of the device 110 is greater than the oxide to nitride ratio above the center region 111 of the device 110. Thus, an etch process (e.g., a reactive ion etch (RIE) process) can be performed for a predetermined period of time and then terminated. This predetermined period of time can be a time period just sufficient for the contact openings 145 to reach the end regions 112 of the device 110. In this case, the slower etch rate through the thicker nitride materials above the center region 112 of the device 110 will ensure that the incomplete contact opening(s) 165 do not reach the device 110 (i.e., that the depth 192 of the incomplete contact opening(s) 165 is shallower than the depth 191 than the contact openings 145).

Alternatively, to form the contact and incomplete contact openings 145, 165, a multi-step selective reactive ion etch (RIE) process can be performed. First, for both the contact openings 145 and the incomplete contact opening(s) 165, the oxide material can be selectively etched over the nitride material until both openings 145, 165 reach a nitride layer (e.g., by a reactive ion etch (RIE) process in which process parameters are controlled for oxide selectivity). Second, also for both the contact openings 145 and incomplete contact opening(s) 165, the nitride material can be selectively etched over the device material for a predetermined period of time and then terminated (e.g., by another RIE process in which the process parameters are controlled for nitride selectivity). This predetermined period of time can be a time period just sufficient for the contact openings 145 to reach the end regions 112 of the device 110. However, since the combined thickness 134 of the nitride materials above the center region 112 of the device 110 is greater than the combined thickness 136 of the nitride materials above the end regions 112 of the device 110, the incomplete contact opening(s) 165 will not reach the device 110 (i.e., the depth 192 of the incomplete contact opening(s) 165 will be shallower than the depth 191 than the contact openings 145).

It should be understood that the corresponding structures, materials, acts, and equivalents of all means or step plus function elements in the claims below are intended to include any structure, material, or act for performing the function in combination with other claimed elements as specifically claimed. Additionally, it should be understood that the above-description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the invention for various embodiments with various modifications as are suited to the particular use contemplated. Well-known components and processing techniques are omitted in the above-description so as to not unnecessarily obscure the embodiments of the invention.

Finally, it should also be understood that the terminology used in the above-description is for the purpose of describing particular embodiments only and is not intended to be limiting of the invention. For example, as used herein, the singular forms "a", "an" and "the" are intended to include the plural forms as well, unless the context clearly indicates otherwise. Furthermore, as used herein, the terms "comprises", "comprising," and/or "incorporating" when used in this specification, specify the presence of stated features, integers, steps, operations, elements, and/or components, but do not preclude the presence or addition of one or more other features, integers, steps, operations, elements, components, and/or groups thereof.

Therefore, disclosed above are embodiments of a semiconductor structure that incorporates multiple nitride layers (e.g., silicon nitride (SiN) layers) stacked between the center region of a device (e.g., a thermally sensitive device, such as a polysilicon resistor) and a blanket oxide layer (e.g., a silicon dioxide ($SiO_2$) layer). These nitride layers are more thermally conductive than the blanket oxide layer (e.g., 1.1 W/m–K for $SiO_2$ versus 30 W/m–K for a SiN layer) and, thus provide improved heat dissipation away from the device (e.g., a 2° C. or greater temperature decrease for worst cases of heating). Optionally, incomplete contacts can extend through the blanket oxide layer into one or more of the nitride layers without contacting the device in order to further improve heat dissipation (e.g., an additional 2° C. or greater temperature decrease in a specific location of the device adjacent to the incomplete contact). Also disclosed are embodiments of a method of forming such a semiconductor structure. In the method embodiments, the multiple nitride layers can be formed above the center region of the device in conjunction with the formation of any of the following nitride layers during standard processing of other devices: a nitride hardmask layer (OP layer), a "sacrificial" nitride layer (SMT layer), a tensile nitride layer (WN layer) and/or a compressive nitride layer (WP layer). Thus, formation of the nitride layers involves adjustments to the data prep mask levels so that most, if not all, available nitride levels in the process flow are placed over the device to provide heat dissipation. Optionally, at the same time as contacts are formed to the end regions of the device, one or more incomplete contacts can also be formed above the center region of the device to provide additional heat dissipation. Due to the difference in the oxide-to-nitride material ratio above the center region of the device as compared to above the end regions of the device, the openings for the incomplete contact(s) will self-arrest prior to reaching the device.

What is claimed is:

1. A semiconductor structure comprising:
   a device; and
   multiple nitride layers above said device, said multiple nitride layers comprising at least:
      a first nitride layer conformally covering said device;
      a second nitride layer conformally covering said first nitride layer; and
      a third nitride layer above said second nitride layer, said device, said first nitride layer and said second nitride layer having end regions extending laterally beyond said third nitride layer.

2. The semiconductor structure of claim 1, said device generating heat and said multiple nitride layers conducting said heat away from said device.

3. The semiconductor structure of claim 1, said device comprising any of a resistor, a diode, a capacitor, and an inductor.

4. The semiconductor structure of claim 1, further comprising a fourth nitride layer between said first nitride layer and said second nitride layer, said end regions of said device, of said first nitride layer and of said second nitride layer further extending laterally beyond said fourth nitride layer.

5. The semiconductor structure of claim 1, further comprising:
   a blanket oxide layer having a first portion above said third nitride layer and second portions extending laterally beyond said third nitride layer such that said first portion is thinner than said second portion; and
   contacts extending vertically through said blanket oxide layer, said second nitride layer and said first nitride layer to said end regions of said device.

6. The semiconductor structure of claim 5, further comprising a silicide layer between said contacts and said end regions of said device.

7. The semiconductor structure of claim 5, said contacts each having, at a level of said third nitride layer, an inner sidewall in contact with said third nitride layer and an outer sidewall in contact with said blanket oxide layer.

8. A semiconductor structure comprising:
a device;
multiple nitride layers comprising at least:
a first nitride layer conformally covering said device;
a second nitride layer conformally covering said first nitride layer; and
a third nitride layer above said second nitride layer, said device, said first nitride layer and said second nitride layer having end regions extending laterally beyond said third nitride layer;
a blanket oxide layer having a first portion above said third nitride layer and second portions extending laterally beyond said third nitride layer such that said first portion is thinner than said second portion;
contacts extending vertically through said blanket oxide layer, said second nitride layer and said first nitride layer to said end regions of said device; and
at least one incomplete contact positioned laterally between said contacts, said at least one incomplete contact extending vertically through said blanket oxide layer and into at least said third nitride layer without contacting said device, said at least one incomplete contact having a shallower depth than said contacts.

9. The semiconductor structure of claim 8, said device generating heat and said multiple nitride layers conducting said heat away from said device.

10. The semiconductor structure of claim 8, said device comprising any of a resistor, a diode, a capacitor, and an inductor.

11. The semiconductor structure of claim 8, further comprising a fourth nitride layer between said first nitride layer and said second nitride layer, said end regions of said device, of said first nitride layer and of said second nitride layer extending laterally beyond said fourth nitride layer.

12. The semiconductor structure of claim 11, further comprising a silicide layer between said contacts and said end regions of said device.

13. The semiconductor structure of claim 11, said contacts each having, at a level of said third nitride layer, an inner sidewall in contact with said third nitride layer and an outer sidewall in contact with said blanket oxide layer.

14. A method of forming a semiconductor structure, said method comprising:
forming a device on a semiconductor wafer; and
after said forming of said device, performing at least three discrete nitride deposition and patterning processes in order to form multiple nitride layers at various locations on said semiconductor wafer and, during said performing of said at least three discrete nitride deposition and patterning processes, forming all of said multiple nitride layers above a center region of said device such that end regions of said device extend laterally beyond an upper one of said multiple nitride layers.

15. The method of claim 14, said performing of said at least three discrete nitride deposition and patterning processes comprising:
forming a first nitride layer that conformally covers said device;
forming a second nitride layer that conformally covers said first nitride layer; and
forming a third nitride layer above said second nitride layer and patterning said third nitride layer such that said end regions of said device and end regions of said first nitride layer and of said second nitride layer extend laterally beyond said third nitride layer.

16. The method of claim 14, said forming of said device comprising forming any of a resistor, a diode, a capacitor, and an inductor.

17. The method of claim 15, said performing of said at least three discrete nitride deposition and patterning processes further comprising, after said forming of said first nitride layer and before said forming of said second nitride layer, forming a fourth nitride layer on said first nitride layer and patterning said fourth nitride layer such that said end regions of said device and of said first nitride layer extend laterally beyond said fourth nitride layer.

18. The method of claim 14, further comprising:
forming contact openings that extend vertically through said blanket oxide layer, said second nitride layer and said first nitride layer to said end regions of said device; and
filling said contact openings with a conductor to form contacts to said end regions of said device.

19. The method of claim 14, further comprising, before said forming of said second nitride layer,
forming trenches in said first nitride layer to expose surfaces of said end regions of said device; and
forming a silicide layer on said surfaces.

20. The method of claim 18, said forming of said openings comprising:
patterning said contact openings such that, at a level of said third nitride layer, each of said contacts has an inner sidewall in contact with said third nitride layer and an outer sidewall in contact with said blanket oxide layer.

21. A method of forming a semiconductor structure, said method comprising:
forming a device on a semiconductor wafer;
forming a first nitride layer that conformally covers said device;
forming a second nitride layer that conformally covers said first nitride layer; and
forming a third nitride layer above said second nitride layer and patterning said third nitride layer such that end regions of said device, of said first nitride layer and of said second nitride layer extend laterally beyond said third nitride layer;
depositing a blanket oxide layer such that a first portion of said blanket oxide layer is above said third nitride layer, such that second portions of said blanket oxide layer extend laterally beyond said third nitride layer and such that said first portion is thinner than said second portion;
forming a plurality of openings comprising:
contact openings extending vertically through said blanket oxide layer, said second nitride layer and said first nitride layer to said end regions of said device; and
at least one incomplete contact opening positioned laterally between said contact openings, said at least one incomplete contact opening extending vertically through said blanket oxide layer and into at least said third nitride layer without contacting said device, wherein said at least one incomplete contact opening has a shallower depth than said contact openings; and
filling said contact openings and said at least one incomplete contact opening with a conductor to form contacts and incomplete contacts, respectively.

22. The method of claim 21, said forming of said device comprising forming any of a resistor, a diode, a capacitor, and an inductor.

23. The method of claim 21, further comprising, after said forming of said first nitride layer and before said forming of said second nitride layer, forming a fourth nitride layer on said first nitride layer and patterning said fourth nitride layer such that said end regions of said device and of said first nitride layer extend laterally beyond said fourth nitride layer.

24. The method of claim 21, said forming of said plurality of openings comprising simultaneously forming said contact openings and said at least one incomplete contact opening.

25. The method of claim 21, further comprising, before said forming of said second nitride layer, forming trenches in said first nitride layer to expose surfaces of said end regions of said device; and forming a silicide layer on said surfaces.

* * * * *